United States Patent [19]
Nakamura et al.

[11] Patent Number: 5,148,164
[45] Date of Patent: Sep. 15, 1992

[54] CURRENT GENERATING DEVICE FOR COMPLEMENTARILY GENERATING TWO CURRENTS OF DIFFERENT MAGNITUDES IN RESPONSE TO ONE-BIT DATA

[75] Inventors: Yasuyuki Nakamura; Toshio Kumamoto, both of Hyogo, Japan

[73] Assignee: Mitsubishi Denki Kabushiki Kaisha, Tokyo, Japan

[21] Appl. No.: 685,411

[22] Filed: Apr. 16, 1991

[30] Foreign Application Priority Data

Apr. 23, 1990 [JP] Japan .................................. 2-107195

[51] Int. Cl.⁵ .............................................. H03M 1/80
[52] U.S. Cl. ...................................... 341/136; 341/153
[58] Field of Search ................. 341/136, 144, 153, 154

[56] References Cited

U.S. PATENT DOCUMENTS

| | | | |
|---|---|---|---|
| 4,306,225 | 12/1981 | Geller et al. | 341/153 |
| 4,712,091 | 12/1987 | Schoofs et al. | 341/133 |
| 4,733,218 | 3/1988 | Traa | 341/133 |
| 5,017,919 | 5/1991 | Hull et al. | 341/136 |

OTHER PUBLICATIONS

"A CMOS Triple 100-Mbit/s Video D/A Converter with Shift Register and Color Map", IEEE Journal of Solid-State Circuits, vol. SC-21, No. 6, by Kuang K. Chi et al., pp. 989-996, Dec. 1986.

Primary Examiner—Marc Hoff
Attorney, Agent, or Firm—Lowe, Price, LeBlanc & Becker

[57] ABSTRACT

A current generating device for generating two different currents having different magnitudes in response to corresponding one-bit data of digital data of a plurality of bits includes: NMOS transistors, (1,2,3), a control signal generating circuit and a supply circuit. The control signal generating circuit generates a voltage (V2) at which NMOS transistors (2,3) can be turned on and a voltage (V3) which is in the range between a ground potential and threshold values of the NMOS transistors and at which NMOS transistors (2,3) can be turned off. The supply circuit complementarily applies voltages (V1,V2) to NMOS transistors (2,3). NMOS transistor (1) generates a current with a predetermined magnitude. NMOS transistors (2,3) respond to voltages (V2, V3) to switch and allow/prevent passage of the predetermined-magnitude current generated by NMOS transistor (1).

12 Claims, 10 Drawing Sheets

CURRENT GENERATING DEVICE FOR COMPLEMENTARILY GENERATING TWO CURRENTS OF DIFFERENT MAGNITUDES IN RESPONSE TO ONE-BIT DATA

BACKGROUND OF THE INVENTION

1. Field of the Invention

The present invention relates generally to current generating devices which respond to one-bit data to complementarily generate two currents of different magnitudes and, more particularly, to a reduction in switching time of the current generating devices and to a suppression in variations of generated currents.

2. Description of the Background Art

A D/A converter is employed for image data processing, a signal generation for controlling a mechanical apparatus, etc. Such a D/A converter is required to further enhance processing speed and the quality of signals.

In order to meet such requirements, a device is provided which responds to video data of a plurality of bits to generate two analog signals and apply one of the analog signals to a dummy load and the other signal to a load (CRT or the like) via a resistor for matching. This device is disclosed in, for example, the article entitled "A CMOS Triple 100 Mbit/s Video D/A Converter with Shift Register and Color Map", IEEE JOURNAL OF SOLID-STATE CIRCUITS, Vol. 21, No. 6, December 1986.

FIG. 7 is a schematic block diagram of a video data D/A converter described in this document. Referring to FIG. 7, this video data D/A converter includes a timing generation circuit 54 responsive to an externally applied pixel clock signal for generating a shift clock signal for internal synchronization, a shift register 51 for converting externally applied parallel video data into serial data, a color map memory 52 for storing color data or the like in advance, a D/A conversion circuit 53 for converting video data of a plurality of bits (16 bits) into complementary analog signals, and a processor interface 55 for writing color data or the like into color map memory 52 in advance and writing a program for serial/parallel conversion into shift register 51.

The video data D/A converter, performs the following operation. Video data of 16 bits is applied to shift register 51 and then converted into serial data of 4-6 bits therein. The converted data is then applied to color map memory 52. Color map memory 52 receives the video data from shift register 51 as address data and responds to a shift clock signal from timing generation circuit 54 to read previously written color data. The read color data is applied to D/A conversion circuit 53 and then converted into complementary analog signals by D/A conversion circuit 53. These analog signals are three types (red, blue, and green) and a synchronizing signal.

FIG. 8 is a circuit diagram showing the details of D/A conversion circuit 53. This D/A conversion circuit 53 includes a supply potential $V_{DD}$, a ground potential GND, output terminals 01 and 02, current sources A1-A16, a dummy resistor R1 connected to output terminal 01, a resistor R2 for output matching connected between output terminal 02 and ground potential GND. Each of current sources A1-A16 includes PMOS transistors 1a, 1b, 2 and 3. PMOS transistors 1a and 1b are connected in series between supply potential $V_{DD}$ and a source (node N1) of PMOS transistor 2. A gate of PMOS transistor 1a is supplied with a bias signal V1a, and a gate of PMOS transistor 1b is supplied with a bias signal V1b. Respective drains of PMOS transistors 2 and 3 are connected to respective output terminals 01 and 02. Respective gates of PMOS transistors 2 and 3 are connected to corresponding ones of data input terminals −D1 to −D16 and +D1 to +D16, through which digital data are complementarily applied. Each of current sources A1-A16 responds to corresponding one-bit data of 16-bit complementary digital data to complementarily switch and generate two currents differing in magnitude. One of the generated two currents is supplied to output terminal 01, and the other is supplied to output terminal 02. As a result, output terminal 01 is provided with an analog signal which is a sum of respective currents flowing through respective PMOS transistors 2. Output terminal 02 is provided with an analog signal which is a sum of respective currents flowing through respective PMOS transistors 3. The analog signals thus obtained are complementary with each other.

As has been described above, complementary or differential switching of PMOS transistors 2 and 3 causes approximately constant currents to always flow through nodes N1. Thus, level changes of analog signals can be suppressed as compared with a switching made by a single switching element. The switching made by the single switching element requires the time to charge or discharge parasitic capacitances shown by the broken lines in FIG. 8. However, since constant currents always flow through nodes N1 by the differential operation of two switching elements, the time required for charging/discharging is unnecessary. This enables a shortening of switching time.

FIG. 9 is a circuit diagram showing an improvement of the current source of FIG. 8. This current source is of the one-bit scheme in order to simplify a description thereof. Referring to FIG. 9, this current source differs from the current source of FIG. 8 in that this current source is provided with a buffer circuit 60 which responds to one bit applied to data input terminals −D and +D to limit voltages to be applied to the respective gates of PMOS transistors 2 and 3. Limiting the gate voltages to be applied to PMOS transistors 2 and 3 suppresses the switching rate of PMOS transistors 2 and 3 and variations of analog signals.

PMOS transistors 2 and 3 to be controlled are, however, put in either a complete ON state or a complete OFF state. That is, resistances between drains and sources are put into either a lowest state or a highest state. It is thus possible that the variations of analog signals cannot sufficiently be suppressed, or the switching time cannot sufficiently be shortened.

FIG. 10 is a circuit diagram showing another example of a conventional current source. Referring to FIG. 10, this current source differs from the one shown in FIG. 9 in that this current source employs NMOS transistors 1, 2 and 3 in place of PMOS transistors 1a, 1b, 2 and 3 and employs a control signal generating circuit B and a supply circuit C in place of buffer circuit 60.

Control signal generating circuit B generates a first control signal V1 for operating NMOS transistor 1 in a saturation region and a second control signal V2 for operating NMOS transistors 2 and 3 in the saturation region. Generated first control signal V1 is output from a first control signal output terminal 4, and second control signal V2 is output from a second control signal output terminal 11.

Supply circuit C includes switch circuits SW1-SW4 which are rendered active when the one-bit data applied to data input terminals −D and +D is at a logic "1" level. Switch circuit SW1 switches between a gate 7 of NMOS transistor 2 and second control signal output terminal 11. Switch circuit SW2 switches between NMOS transistor 2 and a ground potential 5. Switch circuit SW3 switches between a gate 9 of NMOS transistor 3 and second control signal output terminal 11. Switch circuit SW4 switches between gate 9 of NMOS transistor 3 and ground potential 5.

A drain of NMOS transistor 2 is connected to an output terminal 01 which is connected with a supply potential $V_{DD}$ via a dummy resistor R1. A drain of NMOS transistor 3 is connected to an output terminal 02 which is connected with a load via an output matching resistor R2. Respective sources of NMOS transistors 2 and 3 are commonly connected to a drain (node 6) of NMOS transistor 1. A source of NMOS transistor 1 is connected to ground potential 5 and switch circuits SW2 and SW4. A gate of NMOS transistor 1 is supplied with the first control signal.

A description will now be given on an operation of the current source shown in FIG. 10. NMOS transistor 1 operates in a saturation region in response to the first control signal applied from first control signal output terminal 4, to generate a current with a constant magnitude. In this state, when data to be applied to data input terminal −D is "1" and data to be applied to data input terminal +D is "0", switch circuit SW1 is turned on and switch circuit SW2 is turned off. The turning on of switch SW1 causes second control signal V2 to be applied to gate 7 of NMOS transistor 2. As a result, a voltage on gate 7 rises depending on a time constant. The time constant is determined with ON-resistance of switch circuit SW1 and the capacitance between the gate and the source of NMOS transistor 2. When the voltage on gate 7 attains a predetermined potential, NMOS transistor 2 operates in the saturation region, so that a current flows through the path from output terminal 01 through NMOS transistors 2 and 1 to ground potential 5. At this time, since switch circuit SW3 is OFF and switch circuit SW4 is ON, a gate voltage of NMOS transistor 3 attains the ground potential, so that NMOS transistor 3 is turned off.

Conversely, when the data to be applied to data input terminals −D and +D are "0" and "1", respectively, switch circuits SW1 and SW4 are turned off and switch circuits SW2 and SW3 are turned on. As a result, gate 7 of NMOS transistor 2 is grounded, so that NMOS transistor 2 is turned off. Gate 9 of NMOS transistor 3 is supplied with second control signal V2 through second control signal output terminal 11. Accordingly, NMOS transistor 3 operates in the saturation region, so that a current flows from output terminal 02 through NMOS transistors 3 and 1 to ground potential 5. Thus, theoretically, a constant current always flows through NMOS transistor 1, and a potential on node 6 becomes constant.

In the above-described manner, with one of NMOS transistors 2 and 3 brought into a saturated state and the other transistor into OFF state, the current with a constant magnitude is provided at output terminal 01 or 02.

However, gate 7 of NMOS transistor 2 and gate 9 of NMOS transistor 3 are supplied with second control signal V2 and the ground potential via switch circuits SW1-SW4. Second control signal V2 is at a level for operating the NMOS transistors in the saturation region, and the ground potential is at a level for completely turning off the NMOS transistors. Thus, gate voltages having large amplitudes are applied to NMOS transistors 2 and 3.

FIGS. 11A and 11B are diagrams showing voltage changes and current changes in each circuit in the current source of FIG. 10. FIG. 11A shows a voltage 71 on gate 7 and a voltage 91 on gate 9; and FIG. 11B shows a potential 61 on common connection node 6 and a current 81 on output terminal 01. Referring to FIGS. 11A and 11B, if a second control signal is applied to gate 7 of NMOS transistor 2, so that gate 9 of NMOS transistor 3 attains a ground potential, then a deviation occurs in potential change of gate voltage 91 and gate voltage 71 due to influences by the ON-resistance of switch circuit SW1 and the parasitic capacitances on gate terminals of NMOS transistors 2 and 3. This causes a great fluctuation of voltage 61 on common connection node 6, which should ideally be constant, resulting in a great overshoot of output current 81 at output terminal 01.

SUMMARY OF THE INVENTION

One object of the present invention is to, in a current generating device for complementarily generating two different currents having different magnitudes in response to one-bit data, sufficiently suppress a variation of an output current and further shorten switching time by controlling impedance in the event of switching.

Another object of the present invention is to, in a D/A converter for converting digital data including a plurality of bits into complementary analog signals, sufficiently suppress variations of the complementary analog signals and shorten switching time by controlling impedance in the event of switching.

A further object of the present invention is to, in a video data/color signal converter for converting video data including a plurality of bits into complementary color signals, sufficiently suppress variations of the complementary color signals and further shorten switching time by controlling impedance in the event of switching.

Briefly, a current generating device in accordance with the present invention is a current generating device responsive to one-bit data for complementarily generating two different currents having different magnitudes, the current generating device including a constant current generator, first and second switching devices, a first control signal generator, a second control signal generator, a supply device, and first and second output devices. The constant current generator generates a current with a predetermined magnitude. The first and second switching devices complementarily generate an ON state in which the current of the predetermined magnitude generated by the constant current generator is allowed to pass and an OFF state in which the passage of the generated current should be prevented. The first control signal generator generates a first control signal for turning on the first and second switching devices. The second control signal generator generates a second control signal of a level in a predetermined range in which the first or the second switching device can be turned off. The supply device responds to one-bit data to complementarily supply the first and second control signals generated by the first and second control signal generators to the first and second switching devices. The first and second output devices output respective currents from the first and second switching devices, respectively.

In operation, the first control signal is at the level which enables the first and second switching devices to be ON, and the second control signal is at the level which enables the first and second switching devices to be OFF. Thus, the potential difference between the first and second control signals can be made smaller. Accordingly, an impedance change occurring in a switching operation of the first and second switching devices can be made smaller. Consequently, the current with the predetermined magnitude generated by the constant current generator no longer varies, thereby suppressing variations of complementarily output two currents and thus reducing convergence time into a true value.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
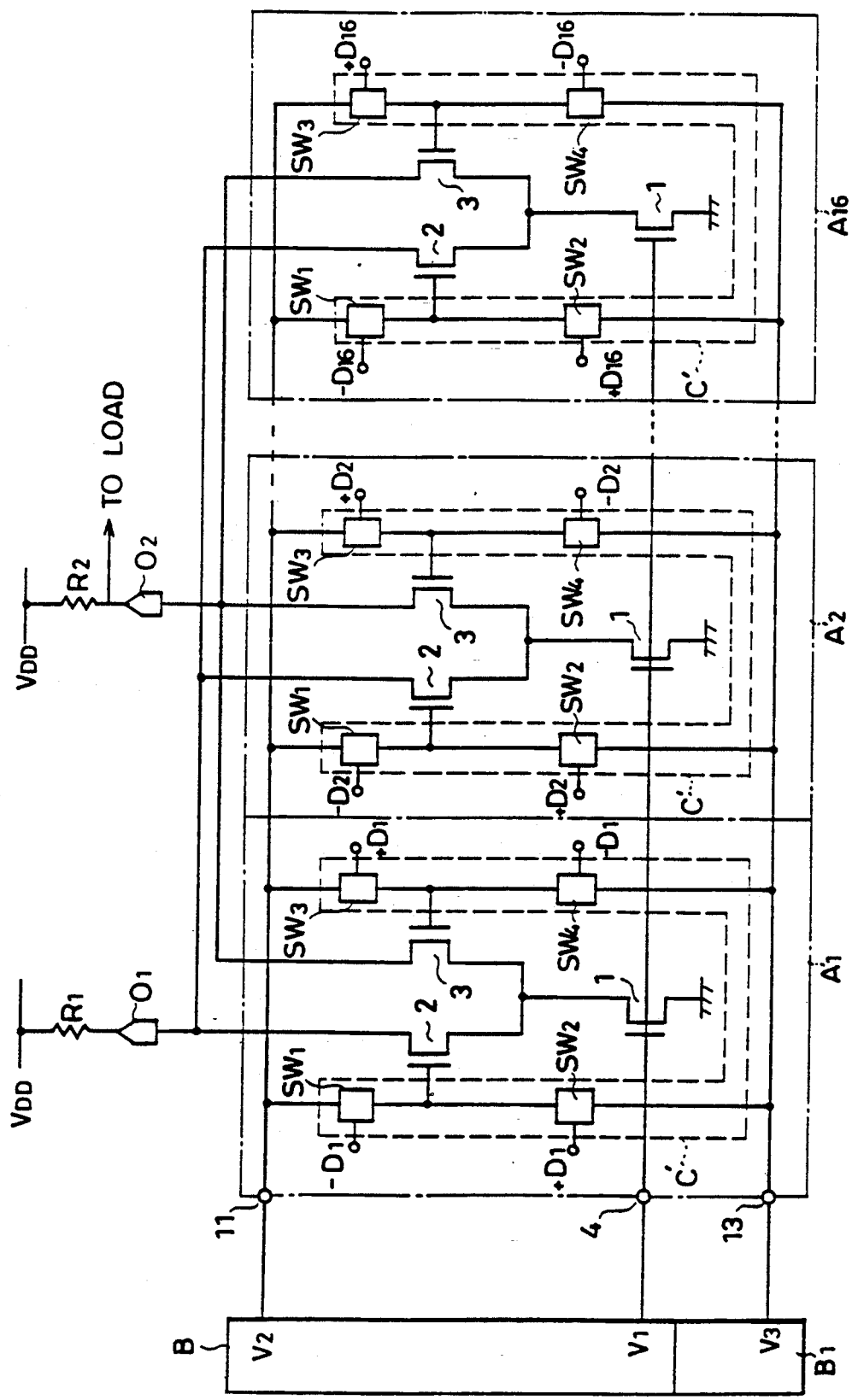
FIG. 1A is a circuit diagram showing one embodiment of a D/A conversion circuit of the present invention.
Figure 1B:
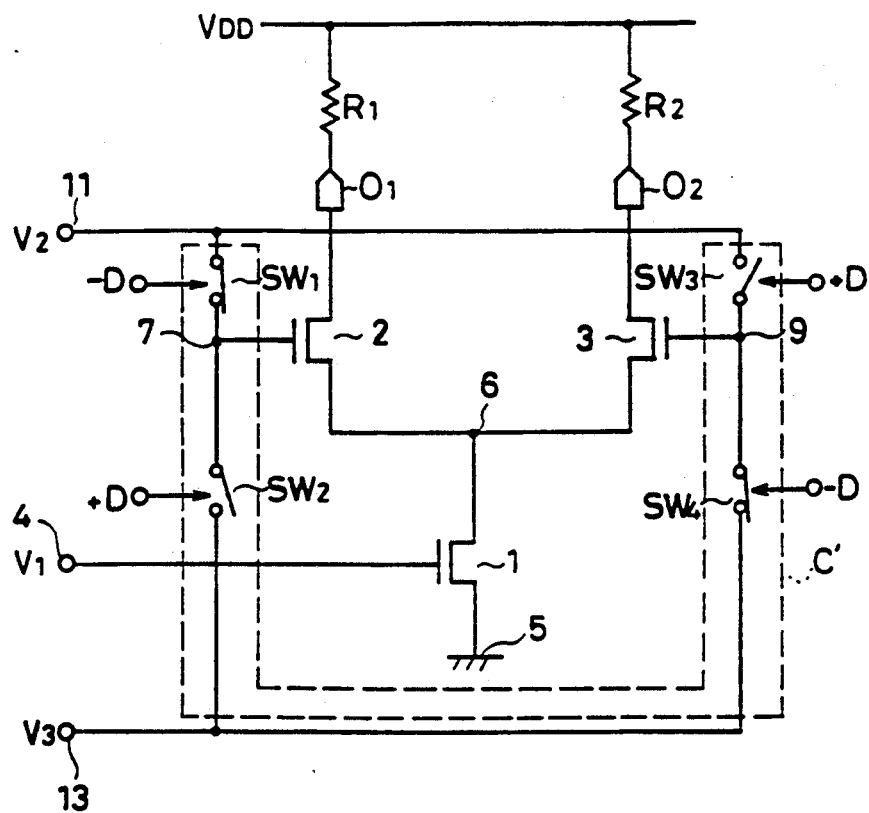
FIG. 1B is a circuit diagram showing the details of a current source employed in FIG. 1A.
Figure 8:
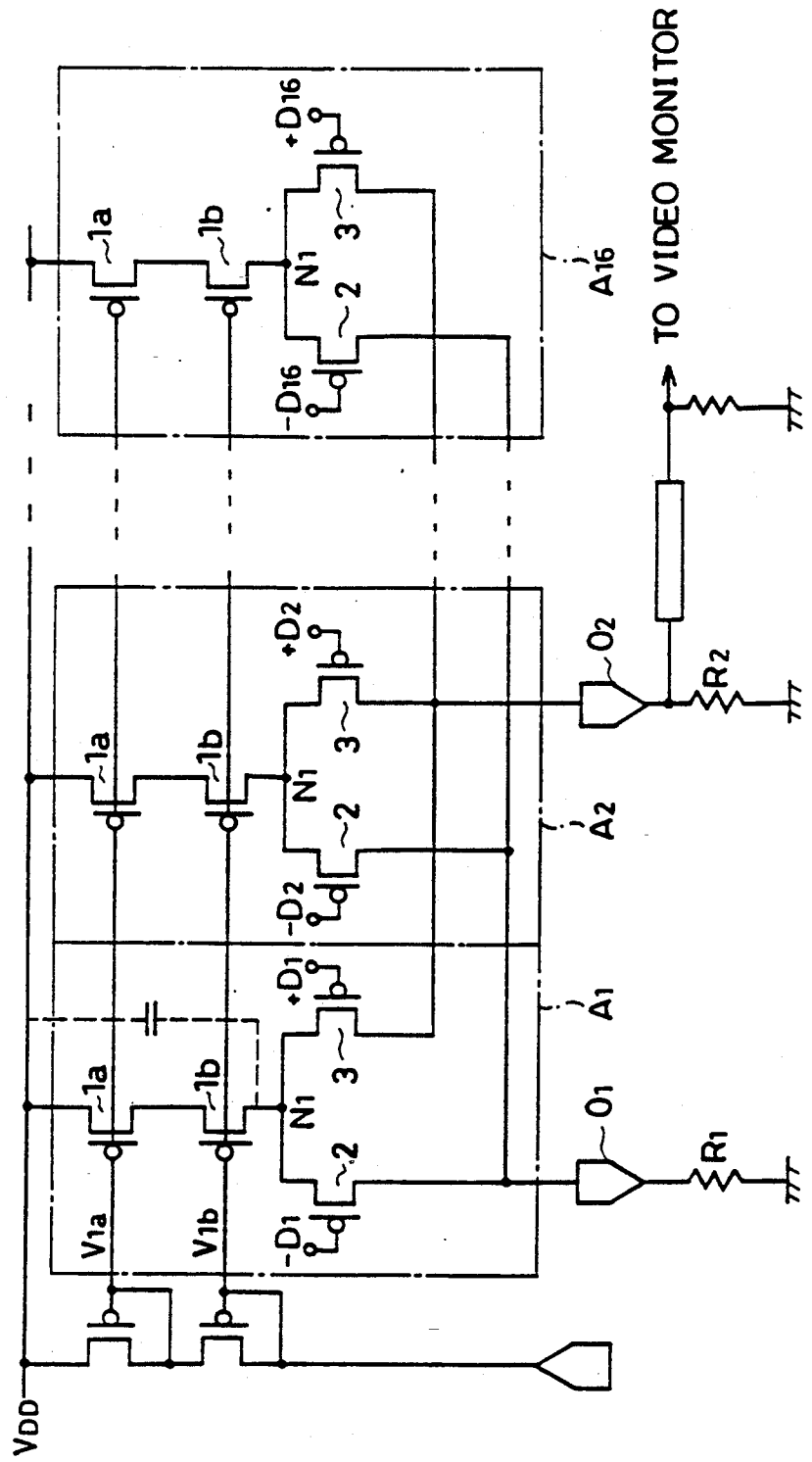
FIG. 8 is a circuit diagram showing the details of a D/A conversion circuit shown in FIG. 7.
Figure 9:
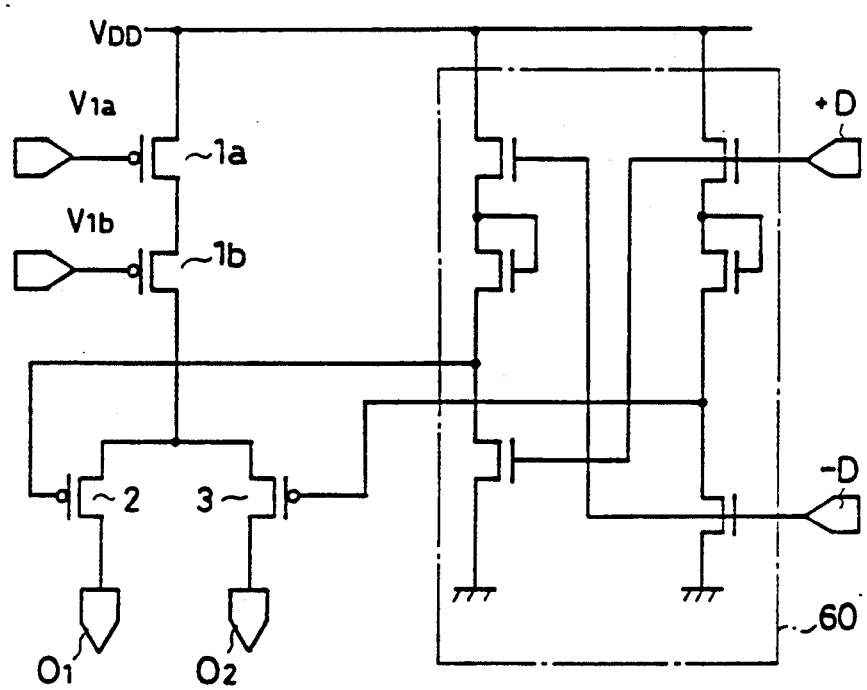
FIG. 9 is a circuit diagram showing an improvement of a current source of FIG. 8.

FIG. 1A is a circuit diagram showing one embodiment of a D/A converter of the present invention, and FIG. 1B is a circuit diagram showing the details of a current source corresponding to one bit in FIG. 1A. Referring to FIG. 1A, this D/A converter is different from the D/A conversion circuit shown in FIG. 8 in that the D/A converter additionally includes a third control signal generator B1 for generating a third control signal V3 at a voltage which allows NMOS transistors 2 and 3 to be OFF, and each of current sources A1–A16 includes a supply circuit C' for complementarily supplying second control signal V2 and third control signal V3.

Third control signal generator B1 outputs third control signal V3 through a third control signal output terminal 13.

Figure 10:
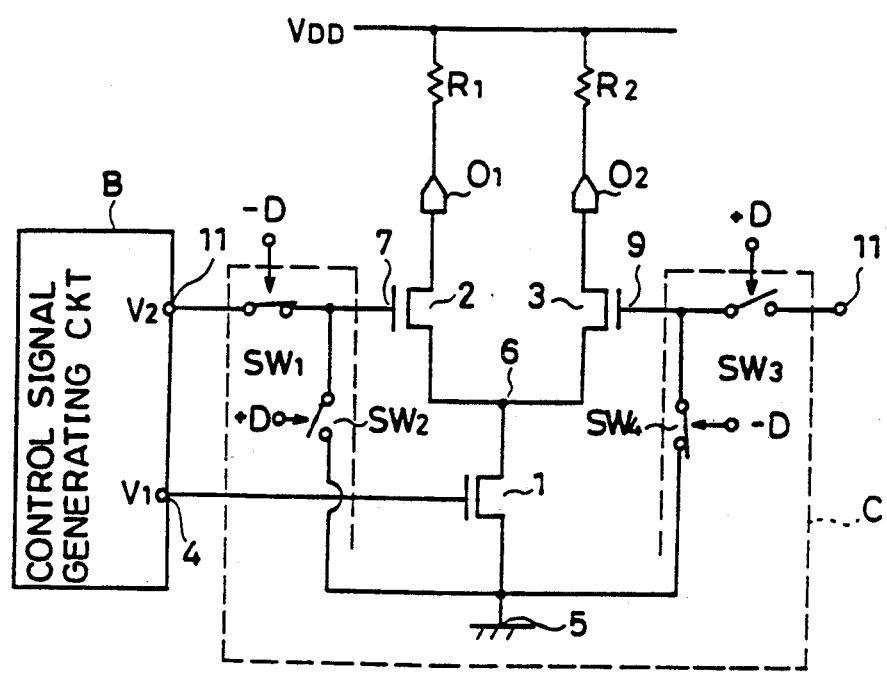
FIG. 10 is a circuit diagram showing another example of a conventional current source.
Figure 11A:
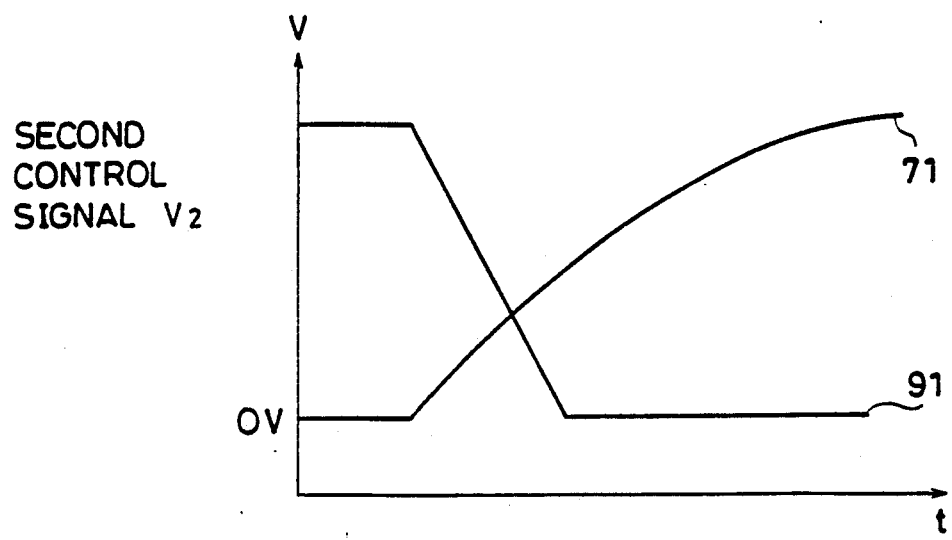
FIGS. 11A and 11B are diagrams showing potential changes and output changes in each circuit of the current source shown in FIG. 10.
Figure 11B:
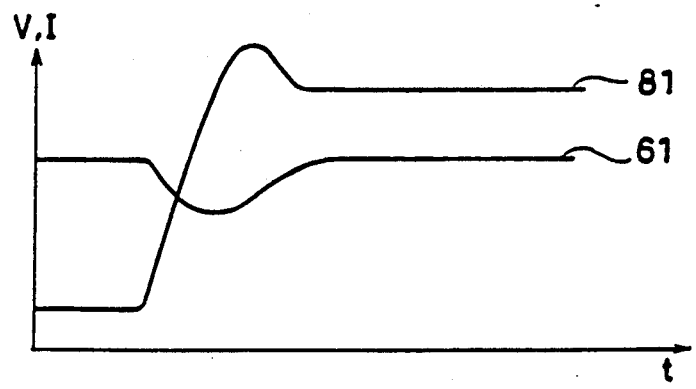

Referring to FIG. 1B, each of these current sources A1–A16 differs from the current source shown in FIG. 10 in that only the source of an NMOS transistor 1 is coupled to a ground potential 5, and switch circuits SW2 and SW4 of supply circuit C' are not coupled to the ground potential but connected to third control signal output terminal 13.

Each of switch circuits SW1–SW4 included in supply circuit C' becomes active when data of one bit applied to data input terminals −D and +D is "1". That is, switch circuit SW1 switches between a gate 7 of NMOS transistor 2 and a second control signal output terminal 11. Switch circuit SW2 switches between gate 7 of NMOS transistor 2 and third control signal output terminal 13. Switch circuit SW3 switches between a gate 9 of NMOS transistor 3 and second control signal output terminal 11. Switch circuit SW4 switches between gate 9 of NMOS transistor 3 and third output terminal 13. With supply circuit C' thus structured, if data "1" and data "0" are applied respectively to data input terminals −D and +D, for example, then switch circuits SW1 and SW4 are turned on at the same time so as to establish a path through which second and third control signals V2 and V3 are applied respectively to NMOS transistors 2 and 3. Conversely, if the data "0" and "1" are applied respectively to data input terminals −D and +D, then switch circuits SW2 and SW3 are turned on at the same time so as to establish a path through which second and third control signals V2 and V3 are applied respectively to NMOS transistors 3 and 2.

Second control signal V2 generated by a control signal generating circuit B attains a level at which NMOS transistors 2 and 3 operate in a saturation region, like the conventional example. This level is set in the range of $V_{TH} < V2 < V_{DS} + V_{TH}$. $V_{DS}$ is a potential between drains and sources, and $V_{TH}$ is a threshold voltage. Third control signal V3 generated by third control signal generating circuit B1 attains a level at which NMOS transistors 2 and 3 can be turned off. This level is set in the range of $GND < V3 < V_{TH}$. Setting the levels of second and third control signals V2 and V3, in the above respective ranges decreases the potential difference between second and third control signals V2 and V3, and thus makes it possible to sufficiently suppress output changes in the event of the switching of NMOS transistors 2 and 3 and shorten convergence time into a true value.

Figure 2:
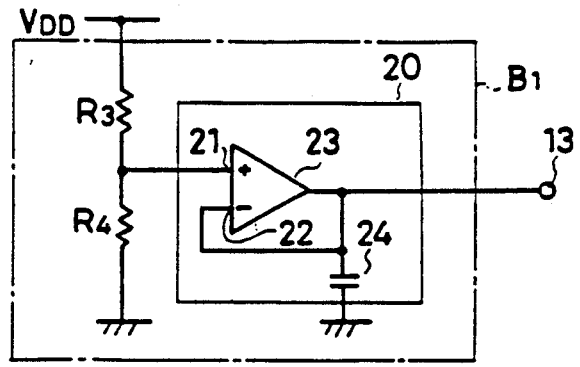
FIG. 2 is a circuit diagram showing the details of a third control signal generating circuit B1.

FIG. 2 is a circuit diagram showing the details of the third control signal generating circuit. Referring to FIG. 2, this third control signal generating circuit B1 includes resistors R3 and R4 connected in series between a supply voltage $V_{DD}$ and a ground potential, and a buffer circuit 20. Resistors R3 and R4 divide th supply voltage to generate a voltage corresponding to the level of third control signal V3. Buffer circuit 20 includes a positive-phase input terminal 21, a negative-phase input terminal 22, an amplifier element 23 for generating third control signal V3 in response to signals applied to positive-phase input terminal 21 and negative-phase input terminal 22, and a capacitor 24. The voltage generated by resistors R3 and R4 is applied to positive-phase input terminal 21. Third control signal V3 is fedback to negative-phase input terminal 22. Capacitor 24 is coupled between third control signal output terminal 13 and the ground potential and stabilizes third control signal V3 output through output terminal 13.

Figure 3:
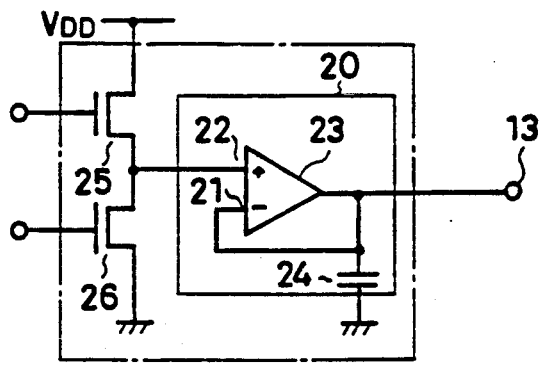
FIG. 3 is a circuit diagram showing a modification of third control signal generating circuit B1 of FIG. 2.
Figure 4:
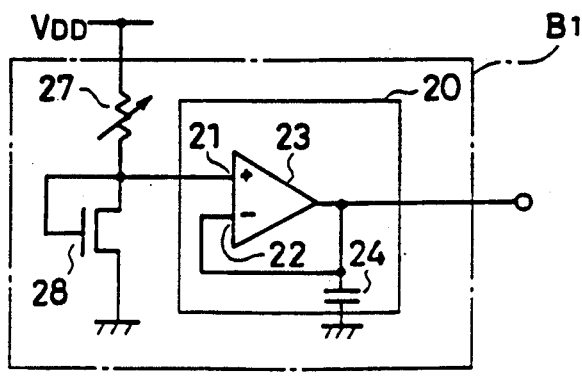
FIG. 4 is a circuit diagram showing another modification of third control signal generating circuit B1 of FIG. 2.

FIGS. 3 and 4 are circuit diagrams showing modifications of third control signal generating circuit B1. This third control signal generating circuit differs from the circuit of FIG. 3 in that NMOS transistors 25 and 26 are provided in place of resistors R3 and R4. Respective gates of NMOS transistors 25 and 26 are provided with respective bias signals, so that a potential on the connection point between NMOS transistors 25 and 26 attains the potential of third control signal V3.

Referring to FIG. 4, this third control signal generating circuit B1 differs from the circuit of FIG. 2 in that a variable resistor 27 and an NMOS transistor 28 are provided in place of resistors R3 and R4. NMOS transistor 28 has its gate and its drain coupled with each other. That is, variable resistor 27 and NMOS transistor 28 divide a supply voltage to generate a voltage of a level corresponding to third control signal V3.

A description will now be made on an operation of the D/A converter shown in FIGS. 1A–4.

In response to first control signal V1, all NMOS transistors 1 operate in a saturated state to generate currents with definite magnitudes. In this state, if digital data are applied to data input terminals −D1 to −D16 and +D1 to +D16, then switch circuits SW1–SW4 included in each of current sources A1–A16 switch in response to corresponding one-bit data so as to complementarily applied second control signal V2 and third control signal V3 to NMOS transistors 2 and 3. In response to complementarily applied second and third control signals V2 and V3, NMOS transistor 2 switches between NMOS transistor 1 and output terminal 01, and NMOS transistor 3 switches between NMOS transistor 1 and output terminal 02. The switching relation between NMOS transistors 2 and 3 is a complementary relation. Currents flowing through respective NMOS transistors 2 are supplied to first output terminal 01 and summed therein. Currents passing through respective NMOS transistors 3 are supplied to second output terminal 02 and summed therein. The summed currents obtained at first and second output terminals 01 and 02 become analog signals having the complementary relation. The analog signal obtained at output terminal 01 is applied to dummy resistor R1, and the other signal obtained at second output terminal 02 is applied via output matching resistor R2 to the load.

Figure 5A:
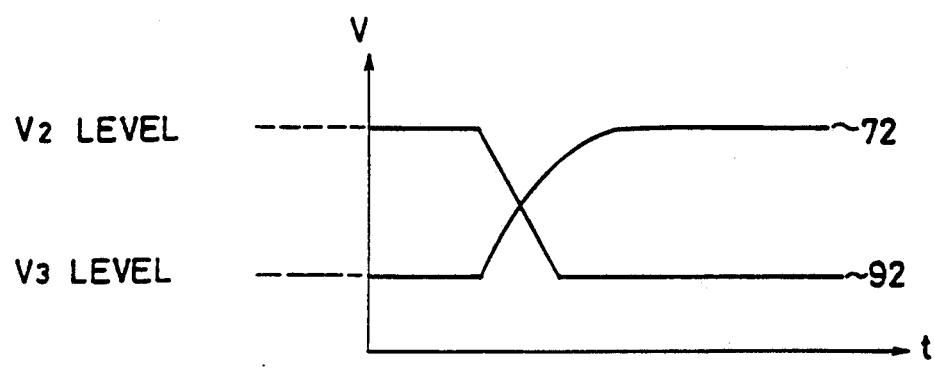
FIGS. 5A and 5B are diagrams showing waveforms of an output voltage and an output current of each circuit of FIG. 1B.
Figure 5B:
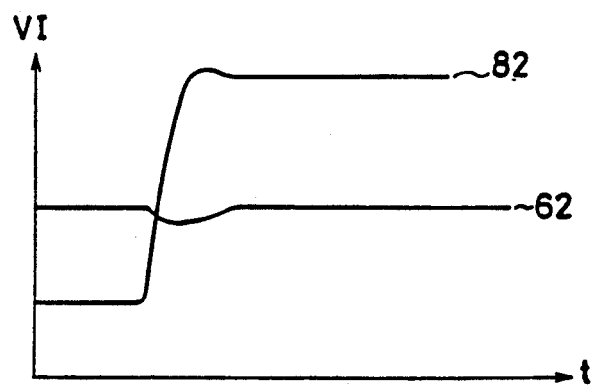

A description will now be given on an operation with respect to one-bit data, with reference to the single current source shown in FIG. 1B. FIGS. 5A and 5B are waveform diagrams showing output voltage changes and output current changes in each circuit of the current source in this operation. FIG. 5A shows a voltage 72 of gate 7 and a voltage 92 on gate 9. FIG. 5B shows a voltage 62 on common connection node 6 and a current 82 at output terminal 01.

When the one-bit data applied to data input terminals −D and +D are, for example, "1" and "0", switch circuits SW1 and SW4 are turned on at the same time, and switch circuits SW2 and SW3 are turned off at the same time. In response to the turning on and off, second control signal V2 is applied via switch circuit SW1 to NMOS transistor 2, and third control signal V3 is applied via switch circuit SW4 to NMOS transistor 3. Voltage 72 on gate 7 of NMOS transistor 2 rises depending on a time constant determined with ON-resistance of switch circuit SW1 and a capacitance between the gate and the source of NMOS transistor 2. When gate voltage 72 exceeds a predetermined level, NMOS transistor 2 operates in a saturation region, so that a current flows through a path from output terminal 01 via NMOS transistors 2 and 1 to GND 5. NMOS transistor 3 is turned off in response to applied third control signal V3.

In the foregoing operation, NMOS transistors 2 and 3 have their respective gates 7 and 9 supplied with signals of the level determined by the difference between second and third control signals V2 and V3. In this manner, a decrease in voltage amplitudes of the signals applied to respective gate terminals 7 and 9 of NMOS transistors 2 and 3 makes it possible to make the time difference occurring in the event of rising of gate voltage 72 and falling of gate voltage 92 relatively smaller. Thus, the difference in timing to turn on/off NMOS transistors 2 and 3 becomes smaller. This makes it possible to make the change of potential 62 on common connection node 6 smaller and make the overshoot of output current 82 due to the change of potential 62 on common connection node 6 smaller. As has been described above, the time period required from the input of one-bit data applied to data input terminals −D and +D to the convergence of the output current into a true value is shortened.

Figure 6:
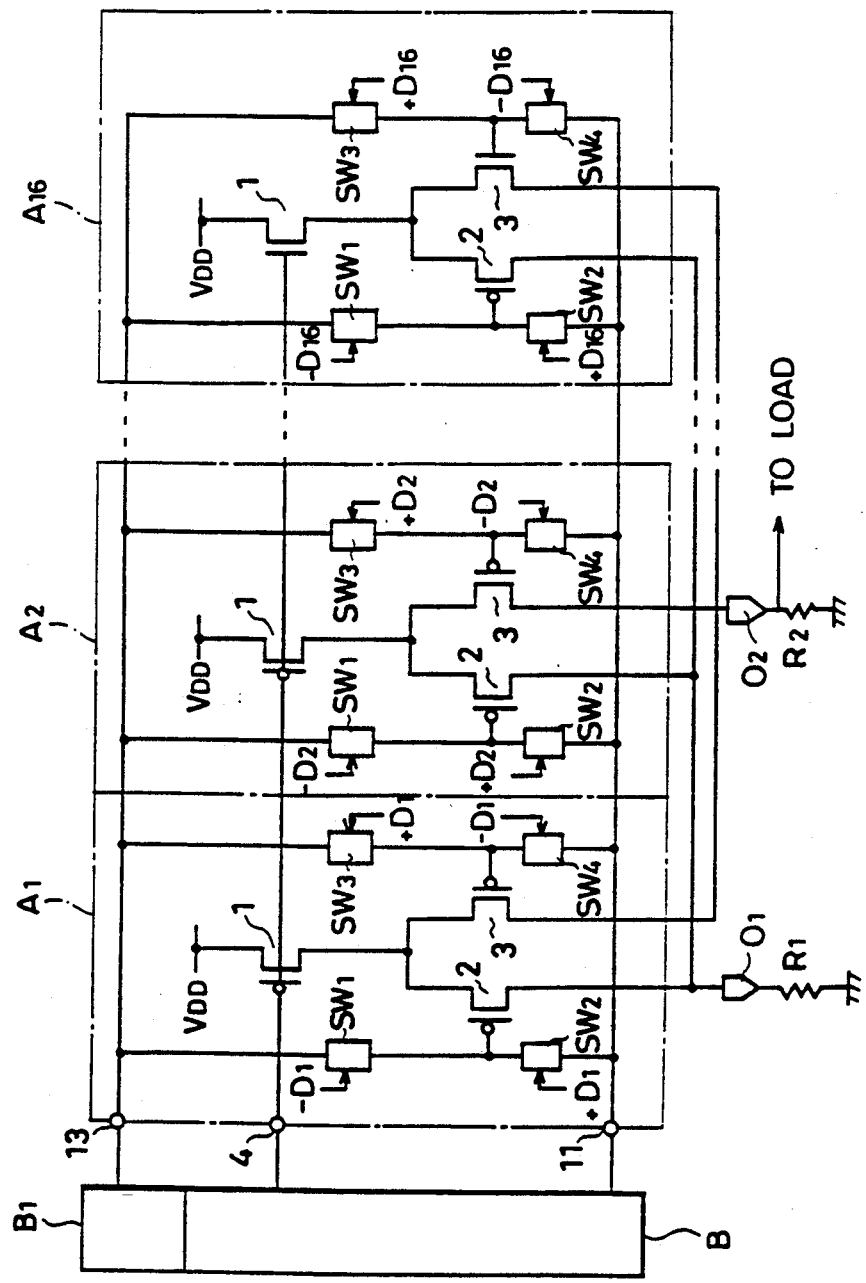
FIG. 6 is a circuit diagram showing another embodiment of the D/A converter of the present invention.
Figure 7:
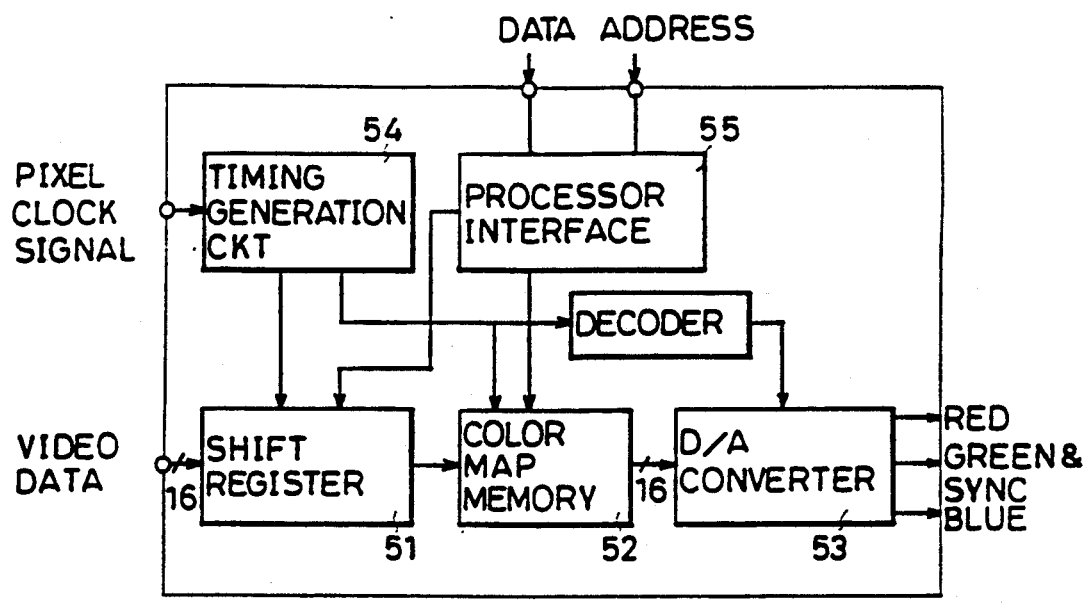
FIG. 7 is a schematic block diagram of a conventional video data D/A converter.

FIG. 6 is a diagram showing another embodiment of the D/A converter. This D/A converter is different from that of FIG. 1A in that PMOS transistors 1, 2 and 3 are employed in place of NMOS transistors 1, 2 and 3. An operation of this D/A converter is similar to that of the D/A converter shown in FIG. 1A.

As has been mentioned above, control elements employed in current sources A1–A16 may include two conduction terminals and one control terminal and may control a current flowing across these two conduction terminals in response to a control signal applied to the control terminal. Bipolar transistors or the like other than PMOS transistors or NMOS transistors can also be employed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A current generating device for complementarily generating two different currents having different magnitudes in response to one-bit data, comprising:
   constant current generating means for generating a current having a predetermined magnitude;
   first and second switching means for complementarily generating an ON state which allows passage of the current with the predetermined magnitude generated by said constant current generating means and an OFF state which prevents the passage of the current with the predetermined magnitude;
   first control signal generating means for generating a first control signal for turning on said first and second switching means;
   second control signal generating means for generating a second control signal of a level substantially equal to a cutoff voltage at which said first and second switching means can be turned off;
   supply means responsive to said one-bit data for complementarily applying said first and second control signals generated by said first and second control signal generating means to said first and second switching means; and first and second output means for outputting respective currents from said first and second switching means, respectively.

2. The current generating device according to claim 1, wherein said predetermined-magnitude current is a current flowing when said constant current generating means is in an ON state; and, said constant current generating means comprises current control means turned on in response to said first control signal or a supply potential signal, said current control means including:

a first conduction terminal connected to said first and second switching means, a second conduction terminal coupled to a ground potential, and a control terminal supplied with said first control signal or said supply potential signal;

said first switching means including:

a first conduction terminal connected to said constant current generating means, a second conduction terminal connected to said first output means, and a control terminal supplied with said first or second control signal;

said second switching means including:

a first conduction terminal connected to said constant current generating means, a second conduction terminal connected to said second output means, and a control terminal supplied with said first or second control signal.

3. The current generating device according to claim 2, wherein said current control means and said first and second switching means include a field effect transistor; and said first control signal attains a higher potential than a threshold voltage of said field effect transistor, and said second control signal attains a potential between the threshold voltage of said field effect transistor and a ground potential.

4. The current generating device according to claim 2, wherein said current control means and said first and second switching mean include a bipolar transistor; and said first control signal attains a higher potential than a potential between a base and an emitter of said bipolar transistor, and said second control signal attains a potential between the base-emitter potential of said bipolar transistor and the ground potential.

5. A current generating device for complementarily generating two different currents having different magnitudes in response to one-bit data, comprising:

constant current generating means for generating a current having a predetermined magnitude;

first and second switching means for complementarily generating an ON state which allows passage of the current with the predetermined magnitude generated by said constant current generating means and an OFF state which prevents the passage of the current with the predetermined magnitude;

first control signal generating means for generating a first control signal for turning on said first or second switching means;

second control signal generating means for generating a second control signal of a level in a predetermined range in which said first or second control signal generating means to said first and second switching means can be turned off;

supply means responsive to said one-bit data for complementarily applying said first and second control signals generated by said first and second switching means; and first and second output means for outputting respective currents from said first and second switching means, respectively;

wherein said first control signal generating means includes a first control signal output terminal coupled to a supply potential, and said second control signal generating means includes voltage dividing means for dividing a supply voltage to set the level of a second control signal to be generated and buffer means for generating a second control signal corresponding to the level set by said voltage dividing means.

6. The current generating device according to claim 5, wherein said voltage dividing means includes first and second current control means connected in series between the supply potential and the ground potential, said first and second current control means having respective internal resistances controlled in response to externally applied signals.

7. The current generating device according to claim 5, wherein said voltage dividing means includes a plurality of resistor means connected in series between the supply potential and the ground potential.

8. The current generating device according to claim 5, wherein said voltage dividing means includes variable resistor means and a field effect transistor connected in series between the supply potential and the ground potential, said field effect transistor having a gate and a drain coupled with each other.

9. The current generating device according to claim 5, wherein said buffer means includes amplifier means for amplifying a level signal which is voltage-divided by said voltage dividing means, said amplifier means including:

a positive-phase input terminal provided with the level signal set by said voltage dividing means as an input, an output terminal for outputting said second control signal, a negative-phase input terminal connected to said output terminal, and a capacitor coupled between said output terminal and a ground potential.

10. The current generating device according to claim 5, wherein said one-bit data includes two states, and said supply means includes:

first path establishing means responsive to the one state of said one-bit data to become active for establishing a first path through which said first control signal and said second control signal are applied respectively to said first switching means and said second switching means; and second path establishing means responsive to the other state of said one-bit data to become active for establishing a second path through which said second control signal and said first control signal are applied respectively to said first switching means and said second switching means.

11. A D/A converter for converting digital data including a plurality of bits into complementary analog signals, comprising:

a plurality of constant current generating means provided corresponding to the plurality of bits of said digital data for generating respective currents having respective predetermined magnitudes;

a plurality of first and second switching means provided corresponding to said plurality of constant current generating means for complementarily generating an ON state which allows passage of the respective predetermined-magnitude currents generated by corresponding said constant current generating means and an OFF state which prevents the passage of the respective predetermined-magnitude currents;

first control signal generating means for generating a first control signal to turn on said respective first and second switching means;

second control signal generating means for generating a second control signal of a level in a predetermined range in which said respective first and second switching means can be turned off;

a plurality of supply means provided corresponding to said plurality of bits and responsive to corresponding one bit for applying said first and second control signals generated by said first and second control signal generating means to corresponding said first and second switching means;

first summation means for summing the respective current from respective said first switching means to generate an analog signal; and second summation means for summing the respective currents from respective said second switching means to generate an analog signal complementary with the analog signal generated by said first summation means.

12. A video data/color signal converter for converting video data including a plurality of bits into complementary color signals, comprising:

memory means for storing predetermined color data;

timing signal generating means responsive to an externally applied pixel clock signal for generating a clock signal for an internal synchronization;

address data generating means for converting said video data externally applied in parallel into serial data, to generate address data;

reading means responsive to the address data generated by said address data generating means for reading said color data stored in advance;

color data/color signal converting means for converting said color data read by said reading means into complementary color signals, said color data/color signal converting means including:

a plurality of constant current generating means provided corresponding to a plurality of bits of said color data for generating respective currents having respective predetermined magnitudes;

a plurality of first and second switching means provided corresponding to said plurality of constant current generating means for complementarily generating an ON state which allows passage of the respective predetermined-magnitude currents generated by corresponding said constant current generating means and an OFF state which prevents the passage of the respective predetermined-magnitude currents;

first control signal generating means for generating a first control signal for turning on said respective first and second switching means;

second control signal generating means for generating a second control signal of a level in a predetermined range in which said respective first and second switching means can be turned off;

a plurality of supplying means provided corresponding to said plurality of bits and responsive to corresponding one bit for applying said first and second control signal generated by said first and second control signal generating means to corresponding said first and second switching means;

first summation means for summing respective currents from respective said first switching means to generate a color signal; and second summation means for summing respective currents from respective said second switching means to generate a color signal complementary with the color signal generated by said first summation means.

* * * * *